United States Patent [19]

Wolff

[11] Patent Number: 4,691,297

[45] Date of Patent: Sep. 1, 1987

[54] CIRCUIT ARRANGEMENT FOR RECEIVING AND/OR TRANSMITTING SERIALLY APPEARING BINARY SIGNALS IN OR FROM A PROCESSING DEVICE CONTAINING A MICROCOMPUTER OR A MICROPROCESSOR

[75] Inventor: Pieter Wolff, Munich, Fed. Rep. of Germany

[73] Assignee: Siemens Aktiengesellschaft, Berlin and Munich, Fed. Rep. of Germany

[21] Appl. No.: 740,977

[22] Filed: Jun. 4, 1985

[30] Foreign Application Priority Data

Jun. 4, 1984 [DE] Fed. Rep. of Germany ....... 3420786

[51] Int. Cl.$^4$ ..................... G11C 7/00; G11C 19/00
[52] U.S. Cl. ............................................. 364/900
[58] Field of Search ............... 364/900 MS, 200 MS; 307/480 US, 243 US; 377/77, 78, 67; 365/233, 239, 240, 219; 328/105, 104, 154, 153

[56] References Cited

U.S. PATENT DOCUMENTS

| Re. 30,182 | 12/1979 | Howson | 340/347 DD |
|---|---|---|---|
| 3,516,074 | 6/1970 | Enomoto | 364/900 |
| 3,656,150 | 4/1972 | Kato | 340/347 DD |
| 4,402,078 | 8/1983 | Athenes | 364/900 |
| 4,426,685 | 1/1984 | Lorentzen | 364/900 |

OTHER PUBLICATIONS

"Peripheral Design Handbook", Intel Corporation, 1978, pp. 1-24,-1-39.

Primary Examiner—Archie E. Williams, Jr.
Assistant Examiner—Lawrence E. Anderson
Attorney, Agent, or Firm—Hill, Van Santen, Steadman & Simpson

[57] ABSTRACT

For receiving and/or transmitting serially appearing binary signals to and from a processing device containing a microcomputer or microprocessor, the signal receiving lines carrying the serially appearing binary signals are connected by way of individual flip-flop elements to an input of the microcomputer or microprocessor, and signal output lines are connected by way of individual flip-flop elements to respective outputs of the microcomputer or microprocessor. In the microcomputer or microprocessor, the serial appearing binary signals are converted into parallel signals for processing, and the processed parallel signals are reconverted into serial signals for signal transmission.

3 Claims, 1 Drawing Figure

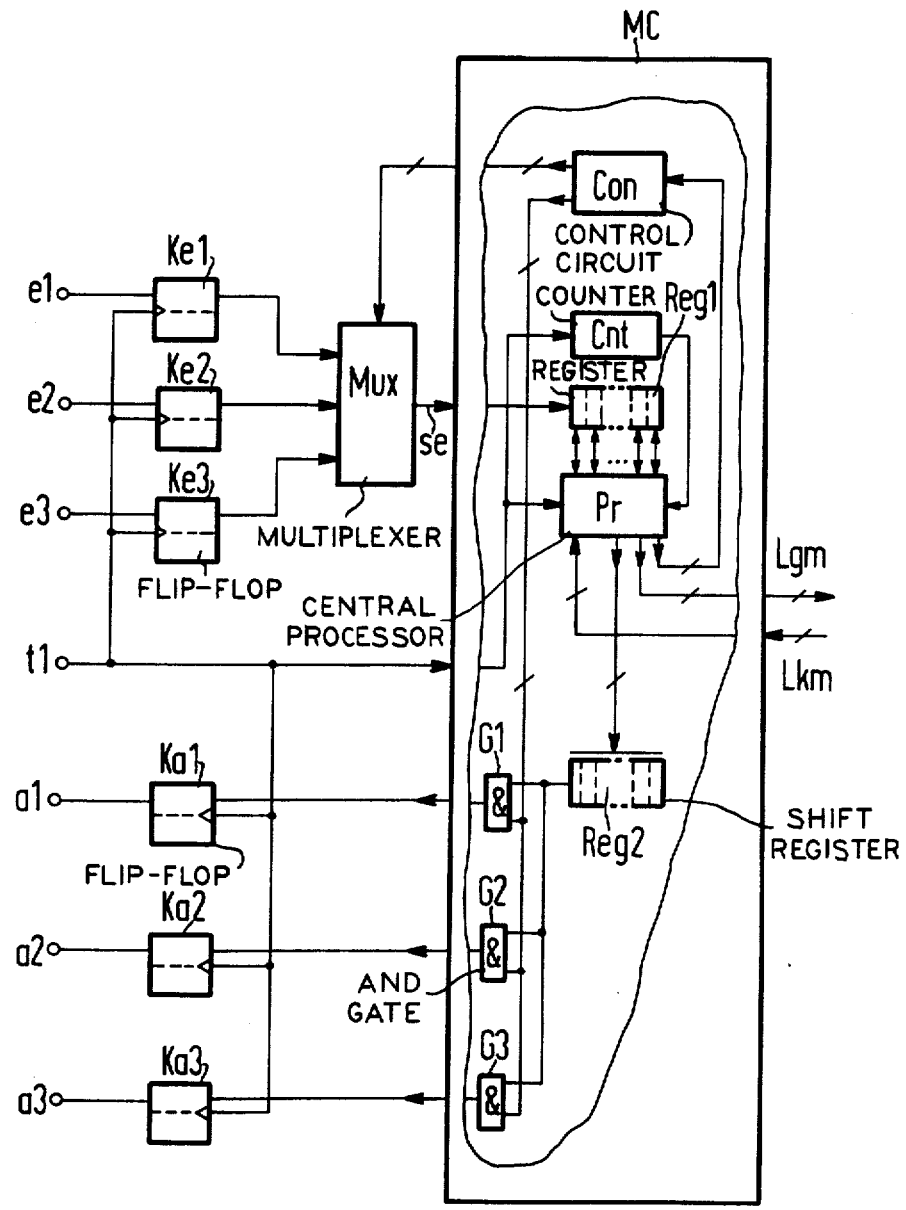

CIRCUIT ARRANGEMENT FOR RECEIVING AND/OR TRANSMITTING SERIALLY APPEARING BINARY SIGNALS IN OR FROM A PROCESSING DEVICE CONTAINING A MICROCOMPUTER OR A MICROPROCESSOR

CROSS REFERENCE TO RELATED APPLICATIONS

This application is related to an application Ser. No. 741,172 filed June 4, 1985 and to an application Ser. No. 740,976 filed June 4, 1985.

BACKGROUND OF THE INVENTION

1. Field of the Invention

The present invention relates to a circuit arrangement for receiving binary signals serially appearing on a plurality of signal receiving lines and for processing these binary signals in the form of parallel signals respectively encompassing a prescribed plurality of bits and/or for the transmission of serially appearing binary signals by way of individual signal output lines after a previously occurring processing of parallel signals respectively encompassing the aforementioned plurality of bits in, or, respectively, from a processing device containing a microcomputer or a microprocessor, the processing device being connected at its input and/or output to the signal receiving or, respectively, signal output lines via signal receiving or, respectively, signal transmission devices.

2. Description of the Prior Art

The microcomputers or microprocessors currently used in processing devices are designed such that they are capable of processing binary signals in the respective form of parallel signals. When a serial data stream is to be received or output, separate interface modules are employed between the corresponding receiving lines or, respectively, transmission lines and the respective microcomputer or microprocessor. Such an interface module is, for example, a universal synchronous asynchronous transmitter/receiver module which is also known in the art as an USART module. Such an interface module informs the microcomputer or microprocessor connected thereto when it can receive new parallel signal or characters for transmission or can transmit such a character or parallel signal to the microcomputer or microprocessor. With the assistance of a microcomputer or microprocessor, binary signals can, in fact, be processed in this manner, these binary signals being supplied or forwarded via a plurality of lines designed for serial signal transmission. What is thereby disadvantageous, however, is that the expense connected with offering such interface modules is relatively high. In addition, the costs of such interface modules are on the order of magnitude of that of the microprocessors.

SUMMARY OF THE INVENTION

The object of the present invention, therefore, is to provide a manner in which, given a circuit arrangement of the type initially specified, one can make due with a relatively low circuit technical expense in order to acquire binary signals appearing serially on receiving lines for processing by a microcomputer or a microprocessor or, respectively, to be able to transmit parallel signals processed by the microcomputer or microprocessor in the form of serially appearing binary signals by way of transmission lines.

Given a circuit arrangement of the type initially set forth, the above object is achieved, according to the present invention, in that the signal receiving devices are formed by bistable flip-flop circuits individually associated with the signal receiving lines, these flip-flop elements, clock-controlled, receiving the bits appearing on the individual signal receiving lines and allowing the appertaining bits to be output at the output side via a selection circuit to an input of a clock-controlled microcomputer or microprocessor. Further, at least one internal memory or at least one internal register for receiving the serially appearing bits into individual memory or register cells and for the transmission of a respective parallel signal for processing after receiving the bits in the prescribed plurality, is assigned to the appertaining input in the microcomputer or microprocessor. The signal transmission devices are formed by individual, clock-controlled flip-flop elements which are respectively connected at their outputs directly to the individual signal transmission lines and which, at their inputs, accept the serially offered bits from the output of the microcomputer or microprocessor, these bits being transmitted from individual memory or register cells of at least one internal memory or register provided as an output memory or register in the microcomputer or microprocessor, parallel signals being supplied to the internal memory or register in response to corresponding processing operations.

The present invention provides the advantage that one can make due with a particularly low circuit technical expense in order to be able to accept binary signals serially appearing on a plurality of receiving lines for a processing device containing a microcomputer or microprocessor which is only capable of processing parallel signals and/or to be able to transmit binary signals serially via a plurality of transmission lines from the processing device. According to the invention, one makes due with only one input of the microcomputer or microprocessor for a plurality of receiving lines for the signal receiving device and for the signal transmission devices. The use of relatively involved interface modules such as are usually employed in conjunction with microcomputers or microprocessors is therefore superfluous.

Advantageously, the flip-flop elements forming the signal output devices have their signal inputs connected to individual outputs of the microcomputer or microprocessor which are respectively individually connectible to the output memory or output register by way of individual activation. The advantage of a particularly low circuit technical expense thereby derives for the connection of the signal output devices to the microcomputer or microprocessor.

The selection circuit connected to the output of the flip-flop elements forming the signal receiving devices is preferably formed by a multiplexer circuit which, controlled by a control circuit, only effectively connects one of the appertaining flip-flop elements to the input of the microcomputer or microprocessor. As a result thereof, the advantage of a relatively low circuit technical expense derives for the connection of the individual signal receiving devices to the microcomputer or microprocessor.

Advantageously, the multiplexer circuit is connected at its input to two groups of signal receiving lines and, respectively, one signal receiving line is selected from each group of appertaining lines. At its output, the multiplexer circuit is respectively connected to a separate input of a microcomputer or microprocessor. The advantage thereby derives that signal receiving lines belonging to two different groups of signal receiving lines can be taken into consideration in a relatively simple manner with respect to the binary signals serially transmitted thereby.

BRIEF DESCRIPTION OF THE DRAWING

Other objects, features and advantages of the invention, its organization, construction and operation will be best understood from the following detailed description taken in conjunction with the accompanying drawing on which there is a single figure which is a schematic representation of a circuit arrangement constructed in accordance with the present invention.

DESCRIPTION OF THE PREFERRED EMBODIMENTS

Referring to the drawing, a circuit arrangement is illustrated which comprises a plurality of signal receiving lines, namely three signal receiving lines e1, e2, e3 in the present case, and a plurality of signal output lines, namely three signal output lines a1, a2 and a3 in the present case. The individual bits of the binary signals forming the data signals are respectively serially transmitted by way of these lines which can be data signal lines in accordance with the CCITT recommendation X.21. In the present case, signal receiving devices formed by individual flip-flop elements are individually associated with the signal receiving line e1—e3. The flip-flop element Ke1 pertains to the signal receiving line e1; the flip-flop element Ke2 pertains to the signal receiving line e2; and the flip-flop element Ke3 pertains to the signal receiving line e3. These flip-flop elements are clock-controlled trigger elements which have their clock inputs connected in common to a clock terminal t1 and whose signal inputs are connected to the signal receiving lines e1, e2 and e3, respectively.

Individual signal transmission devices in the form of individual flip-flop elements Ka1, Ka2, Ka3 pertain to the signal output lines a1, a2, a3. The appertaining signal output lines are thereby connected to the outputs of the flip-flop elements. These flip-flop elements are likewise clock-controlled elements which have their clock inputs connected in common to the aforementioned clock terminal t1. The flip-flop elements Ka1, Ka2, Ka3 have their signal inputs connected to separate outputs of a microcomputer or microprocessor MC belonging to a processor device.

A separate input Se of the microcomputer or microprocessor MC is connected by way of a multiplexer circuit Mux to the outputs of the flip-flop elements Ke1, Ke2, Ke3 forming the aforementioned signal receiving devices.

The latter outputs and the former input of the microcomputer or microprocessor MC can respectively be a separate terminal (port) of the microcomputer or microprocessor MC. However, it is also possible to respectively employ only a single terminal as an output or, respectively, input, namely only a single terminal of the parallel data terminals of a microcomputer or microprocessor which are usually available for a data signal transmission.

With respect to the microcomputer or microprocessor MC shown on the drawing, and which belongs to a processing device, a central processor Pr is indicated and may likewise be connected to the clock terminal t1. The central processor Pr has parallel inputs connected to the outputs of an internal register Reg1. This internal register, which can also be formed by an internal memory of the microcomputer under given conditions, has an input connected to the output of the multiplexer circuit Mux. A counter Cnt is also provided and has a counting input connected to the clock terminal t1. At its output, the counter Cnt is connected to the central processor Pr. The counter Cnt counts the plurality of bits serially written into the internal register Reg1 and, after reaching a predetermined number of m bits, emits a control signal to the central processor Pr. In response thereto, the central processor Pr can accept the contents of the internal register Reg1 as a parallel signal and further process the same. It should be noted at this point that the appertaining central processor Pr can be formed by the arithmetic unit ALU which is present in microprocessors.

It is assumed that the aforementioned central processor Pr is designed such that it is capable of receiving and processing parallel signals respectively comprising m bits. The appertaining central processor takes such parallel signals from, on the one hand, the output of the internal register Reg1 and, on the other hand, the central processor emits such parallel signals at its output via parallel lines which are connected to a plurality of parallel lines Lgn indicated externally of the microcomputer or microprocessor MC. It should be pointed out at this point that the connecting lines respectively marked by a slash are parallel lines which may comprise a plurality of individual lines.

At its input, the central processor Pr is connected to further parallel lines Lkn by way of which parallel signals can be supplied to the central processor. Just like the parallel lines Lgm, the parallel lines Lkm in the present case are connected to corresponding terminals of a further processing device which is capable of accepting or, respectively, transmitting parallel signals which respectively comprise m bits.

The central processor Pr of the microcomputer or microprocessor Mc has further parallel outputs connected to the inputs of shift register stages of a further internal register Reg2. This internal register Reg2, which also may be formed by an internal memory of the microcomputer, serves for receiving parallel signals output by the central processor Pr after processing. The individual bits of these parallel signals are serially output from the output of the register Reg2 to the respective inputs of a plurality of AND gates G1, G2 and G3 which receive control signals at their other inputs from a control circuit Con which also serves for controlling the multiplexer circuit Mux discussed above. At its input, the control circuit Con is connected to an output of the central processor Pr. The information signals required for its control tasks are supplied to the control circuit Con by way of this connection. Effected by way of the control signals output at the AND gates G1, G2, G3 is that respectively only one of these AND gates is conditioned to a transmissive condition at one time. As a result of the control signals output to the multiplexer circuit Mux, the multiplexer circuit is respectively set such that only the output of one of the flip-flop elements Ke1, Ke2, Ke3 is connected at any time to the input Se of the microcomputer or microprocessor Mc. Expressed in other terms, this means that such a control occurs on the basis of the control circuit Con that respectively only one of the signal receiving lines e1, e2, e3 and, at the same time, likewise only one of the signal output lines a1, a2, a3 is effectively exploited for signal transmission to or from the microcomputer or microprocessor MC. The control circuit Con can, for example, be formed by the instruction decoder of the microcomputer or microprocessor MC.

The acceptance of the individual bits of the serially appearing binary signals by the flip-flop elements Ke1—Ke3 and Ka1—Ka3 respectively occurs by way of clock control. The clock pulses supplied by way of the clock connection t1 for that purpose, these clock pulses potentially appearing with a clock rate T1, are also supplied to the counting input of the counter Cnt and to the control input of the microcomputer or microprocessor MC. It is assumed that this control input is a matter of a standard interrupt input (INT) of the appertaining microcomputer or microprocessor. In response to the supply of such control signals, the microcomputer or microprocessor MC reacts in such a manner that it transfers the bit currently applied at the input Se into the register Reg1 and/or that it outputs the bits of a parallel signal which has been subjected to processing to the signal output lines a1, a2, a3, respectively, via the register Reg2. The transfer of the bits collected in the register Reg1 into the microprocessor or microcomputer occurs in response to the selection thereof proceeding from the output of the counter Cnt.

It has been generally assumed in the course of the above discussion that the microcomputer or microprocessor MC serially accepts binary bits via one of the signal receiving lines e1—e3 and serially outputs binary signals via one cfthe signal output lines a1—a3. The information regarding what signal receiving line and what signal output line is thereby involved is available to the aforementioned control circuit Con.

As already indicated above, the appertaining information of the control circuit Con can be made available proceeding from the central processor Pr. This, however, presumes that the central processor Pr had previously been supplied with corresponding information signals. Such information signals can be supplied to the central processor Pr via, for example, the parallel lines Lkm. However, it is also conceivable that the appertaining central processor Pr acquire such information signals in that it first has the multiplexer circuit Mux work in a search run via the control circuit Con. The outputs of the flip-flop elements Ke1—Ke3 are thereby successively connected to the input Se. When a change in signal state appears at the input of one of the flip-flop elements Ke1—Ke3, then the control circuit can leave the multiplexer circuit Mux set in the position most recently achieved. In this position, the bits serially appearing via one of the signal receiving lines e1—e3 then proceed successively into the microcomputer or microprocessor MC. The control circuit Con can thereby be further designed such that it simultaneously engages a connection via one of the AND gates G1—G3. If one proceeds on the basis that the data terminal equipment connected at the output to the signal receiving line e1—e3 are also connected at the input to respective signal transmission lines a1—a3, then that respective AND gate of the AND gates G1—G3 is activated via which binary signals can be serially forwarded to the appertaining signal transmission line. Therefore, for example, the two lines e1 and a1 or the two lines e2 and a2 or the two lines e3 and a3 can be respectively actively connected to the microcomputer or microprocessor MC.

In conclusion it should also be pointed out that one may also proceed, according to the present invention, such that the signals appearing on all or on a plurality of the signal receiving lines can be supplied for processing to the microprocessor or microcomputer MC in direct chronological succession via the multiplexer circuit Mux which is switched at a corresponding speed. The switching of the multiplexer circuit thereby occurs after time segments which are respectively shorter than the duration between two clock pulses at the clock terminal t1. The samples, or respectively, signal bits thereby obtained can be deposited in separate registers or memories of the microprocessor or microcomputer MC.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a circuit arrangement for receiving binary signals serially appearing on a plurality of signal receiving lines, processing the binary signals in the form of parallel signals respectively encompassing a prescribed plurality of bits, and for the transmission of serially appearing binary signals via individual signal output lines after a previously ensuing processing of parallel signals respectively comprising the prescribed plurality of bits in and from a processing device containing a microprocessor means which is connected at its input and its output to the signal receiving and, respectively, signal output lines via signal receiving and signal output devices, respectively, the improvement wherein:

the signal receiving devices and the signal output devices each comprise a clock-controlled flip-flop connected to a respective receiving line and a respective output line for receiving serially appearing signal bits to be input and output, respectively;

a selection circuit having an input connected to each of said signal receiving devices and a single output connected to a single input of the microprocessor means such that the selection circuit selects the receiving device to be connected to the single input of the microprocessor means to process all of the received signal bits;

the microprocessor means comprises an input memory which receives the signal bits serially and output the same as parallel signal bits for processing, a microprocessor which processes the parallel signal bits, and an output memory connected to said microprocessor for receiving the processed bits and converting the same into serial form;

common clock means is connected to said signal receiving devices, said signal output devices and said microprocessor means for synchronizing the outputs of said signal receiving devices, said signal output devices and said microprocessor means; and output selection means connected between said output memory and said signal output devices which selectively provides the processed and serial signal data bits thereto to said signal output devices in serial form.

2. The improved circuit arrangement of claim 1, wherein:

said output selection means comprises a plurality of logic devices each interposed between said output memory and said flip-flops of said signal output devices; and a control circuit is connected between said logic circuits and said microprocessor and is operated by said microprocessor to control selection of said signal output devices.

3. The improved circuit arrangement of claim 1, wherein:

said selection circuit comprises a multiplexer connected between the outputs of said flip-flops of said signal receiving devices and said input memory;

a control circuit is connected between said microprocessor and said multiplexer and operable to control said multiplexer for selecting a signal receiving device.

* * * * *